US009077061B2

(12) United States Patent
Tamaru

(10) Patent No.: US 9,077,061 B2
(45) Date of Patent: Jul. 7, 2015

(54) DIRECTIONAL COUPLER

(75) Inventor: Ikuo Tamaru, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 507 days.

(21) Appl. No.: 13/492,962

(22) Filed: Jun. 11, 2012

(65) Prior Publication Data

US 2012/0319797 A1 Dec. 20, 2012

(30) Foreign Application Priority Data

Jun. 14, 2011 (JP) ................................ 2011-131991

(51) Int. Cl.
*H01P 5/18* (2006.01)
*H03H 7/38* (2006.01)

(52) U.S. Cl.
CPC ..................................... *H01P 5/184* (2013.01)

(58) Field of Classification Search
CPC .................................. H01P 5/18; H01P 5/183
USPC .......................... 333/109, 112, 115, 117, 118
See application file for complete search history.

(56) References Cited

U.S. PATENT DOCUMENTS

| | | | | |
|---|---|---|---|---|
| 6,515,556 | B1 | 2/2003 | Kato et al. | |
| 6,600,386 | B1 | 7/2003 | Löbl et al. | |
| 7,042,309 | B2 * | 5/2006 | Podell | 333/112 |
| 7,132,906 | B2 | 11/2006 | Podell | |
| 2011/0273242 | A1 | 11/2011 | Totani et al. | |

FOREIGN PATENT DOCUMENTS

| | | | |
|---|---|---|---|
| CN | 101740845 | A | 6/2010 |
| JP | 04-505532 | A | 9/1992 |
| JP | 8-237012 | A | 9/1996 |
| JP | 10-290108 | A | 10/1998 |
| JP | 2001-044719 | A | 2/2001 |
| JP | 2001-144513 | A | 5/2001 |
| JP | 2007-181063 | A | 7/2007 |
| WO | 2005/001996 | A2 | 1/2005 |
| WO | 2010/082346 | A1 | 7/2010 |

OTHER PUBLICATIONS

Official Communication issued in corresponding European Patent Application No. 12171818.3, mailed on Oct. 8, 2012.
Official Communication issued in corresponding Japanese Patent Application No. 2011-131991, mailed on Jul. 10, 2012.
Official Communication issued in corresponding European Patent Application No. 12171818.3, mailed on Oct. 19, 2012.

* cited by examiner

*Primary Examiner* — Dean Takaoka
(74) *Attorney, Agent, or Firm* — Keating & Bennett, LLP

(57) ABSTRACT

A directional coupler used in a predetermined frequency band includes a main line connected between a first terminal and a second terminal. A first sub line is connected to a third terminal and is electromagnetically coupled to the main line. A second sub line is connected to a fourth terminal and is electromagnetically coupled to the main line. A low pass filter is connected between the first sub line and the second sub line and causes a phase shift to be generated in a passing signal passing therethrough in such a manner that the phase shift monotonically increases within a range from about 0 to about 180 degrees with increasing frequency in the predetermined frequency band.

20 Claims, 13 Drawing Sheets

10a~10c

DIRECTIONAL COUPLER

BACKGROUND OF THE INVENTION

1. Field of the Invention

The present invention relates to directional couplers, and more particularly to directional couplers used in, for example, wireless communication apparatuses that perform communication using high-frequency signals.

2. Description of the Related Art

Known examples of existing directional couplers include a directional coupler disclosed in Japanese Unexamined Patent Application Publication No. 8-237012. This directional coupler is formed by stacking a plurality of dielectric layers on which substantially coil-shaped conductors and ground conductors have been formed. Two of the substantially coil-shaped conductors are provided, one forming a main line and the other forming a sub line. The main line and the sub line are electromagnetically coupled to each other. The substantially coil-shaped conductor is sandwiched between the ground conductors in the stacking direction. A ground potential is applied to the ground conductors. In the above-described directional coupler, when a signal is input to the main line, a signal having a power proportional to the power of the input signal is output from the sub line.

However, in the directional coupler disclosed in Japanese Unexamined Patent Application Publication No. 8-237012, the degree of coupling between the main line and sub line is increased when the frequency of a signal input to the main line is increased (i.e., the amplitude characteristic of a coupling signal is not flat). Hence, even when a signal with constant power is input to the main line, the power of a signal output from the sub line varies when the frequency of the signal varies. Accordingly, an IC connected to the sub line needs to have a capability of compensating the power of the signal in accordance with the frequency of the signal.

SUMMARY OF THE INVENTION

Accordingly, preferred embodiments of the present invention provide a directional coupler in which the amplitude characteristic of a coupling signal is much closer to being flat compared to conventional devices.

According to a preferred embodiment of the present invention, a directional coupler used in a predetermined frequency band includes first to fourth terminals; a main line connected between the first terminal and the second terminal; a first sub line that is connected to the third terminal and electromagnetically coupled to the main line; a second sub line that is connected to the fourth terminal and electromagnetically coupled to the main line; and a phase conversion unit that is connected between the first sub line and the second sub line and that causes a phase shift to be generated in a passing signal passing therethrough.

According to a preferred embodiment of the present invention, the amplitude characteristic of a coupling signal in a directional coupler is much closer to being flat.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, directional couplers according to the preferred embodiments of present invention will be described.

First Preferred Embodiment

Figure 1:
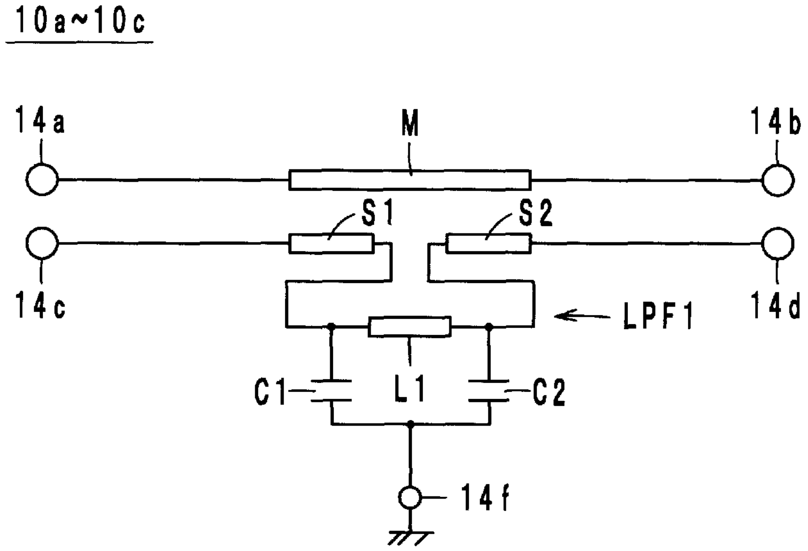
FIG. 1 is an equivalent circuit diagram of directional couplers according to first to third preferred embodiments of the present invention.

Hereinafter a directional coupler according to a first preferred embodiment will be described with reference to the drawings. FIG. 1 is an equivalent circuit diagram of directional couplers 10*a* to 10*c* according to the first to third preferred embodiments.

The circuit configuration of the directional coupler 10*a* will be described. The directional coupler 10*a* is used in a predetermined frequency band. For example, the predetermined frequency band preferably is 824 MHz to 1910 MHz when signals with a frequency band from 824 MHz to 915 MHz (GSM 800/900) and signals with a frequency band from 1710 MHz to 1910 MHz (GSM 1800/1900) are input, for example.

The directional coupler 10*a* includes external electrodes (terminals) 14*a* to 14*f* (the external electrode 14*e* is not shown in FIG. 1), a main line M, sub lines S1 and S2, and a low pass filter LPF1 in the circuit configuration thereof. The main line M is connected between the external electrodes 14*a* and 14*b*. The sub line S1 is connected to the external electrode 14*c* and is electromagnetically coupled to the main line M. The sub line S2 is connected to the external electrode 14*d* and is electromagnetically coupled to the main line M. The sub line S1 and the sub line S2 have the same length.

The low pass filter LPF1 is connected between the sub line S1 and the sub line S2 and is a phase conversion unit that causes a phase shift to be generated in a signal passing therethrough in such a manner that the absolute value of the phase shift monotonically increases within the range from about 0 to about 180 degrees as the frequency increases in the predetermined frequency band. The cut-off frequency of the low pass filter LPF1 is not in the predetermined frequency band. In the present preferred embodiment, the cut-off frequency of the low pass filter LPF1 is spaced apart from a predetermined frequency by about 1 GHz or more. The low pass filter LPF1 includes a coil L1 and capacitors C1 and C2.

The coil L1 is connected in series between the sub lines S1 and S2 and is not electromagnetically coupled to the main line M. The capacitor C1 is connected to one end of the coil L1. Specifically, the capacitor C1 is connected between the external electrode 14*f* and a connection node between the coil L1 and the sub line S1. The capacitor C2 is connected to the other end of the coil L1. Specifically, the capacitor C2 is connected between the external electrode 14*f* and a connection node between the coil L1 and the sub line S2.

In the directional coupler 10*a* described above, the external electrode 14*a* is preferably used as an input port and the external electrode 14*b* is preferably used as an output port, for example. The external electrode 14*c* is preferably used as a coupling port and the external electrode 14*d* is preferably used as a termination port terminated by a resistance of about 50Ω, for example. The external electrode 14*f* is preferably used as a ground port that is grounded. When a signal is input to the external electrode 14*a*, the signal is output from the external electrode 14*b*. Further, since the main line M and the sub lines S1 and S2 are electromagnetically coupled to each other, a signal having a power that is proportional to the power of the signal output from the external electrode 14*b* is output from the external electrode 14*c*.

Figure 2A:
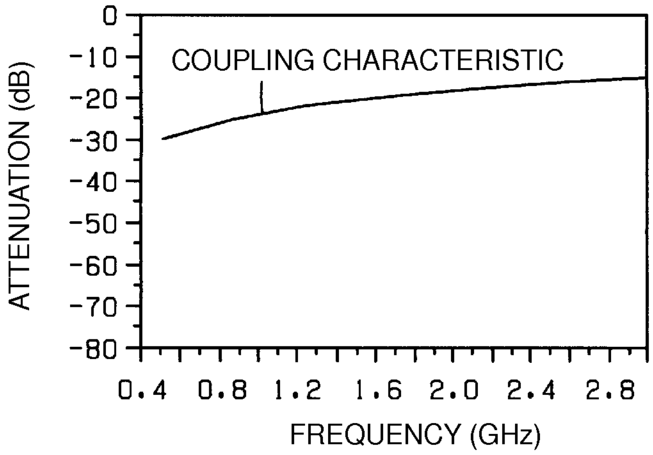
FIG. 2A is a graph illustrating the amplitude characteristic of a coupling signal of an existing directional coupler that does not have a low pass filter.
Figure 2B:
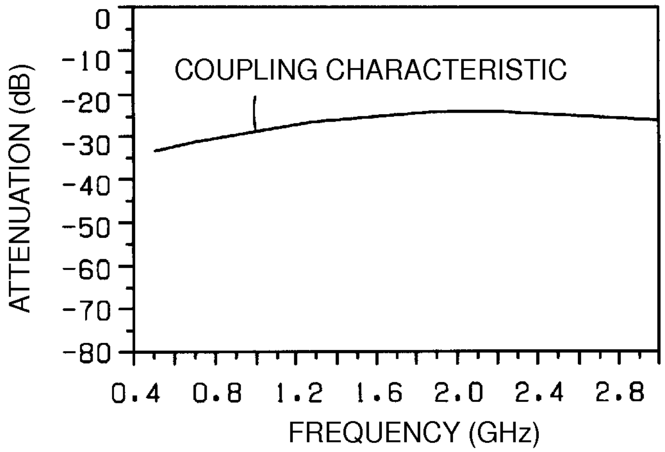
FIG. 2B is a graph illustrating the amplitude characteristic of a coupling signal of a directional coupler.

The directional coupler 10*a* having the circuit configuration described above causes the amplitude characteristic of a coupling signal to be much closer to being flat, as will be described below. FIG. 2A is a graph illustrating the amplitude characteristic of a coupling signal of an existing directional coupler that does not have the low pass filter LPF1. FIG. 2B is a graph illustrating the amplitude characteristic of a coupling signal of the directional coupler 10*a*. FIGS. 2A and 2B illustrate simulation results. Note that the amplitude characteristic is defined as being the relationship between the frequency and the power ratio (i.e., attenuation) of a signal output from the external electrode 14*c* (coupling port) to a signal input to the external electrode 14*a* (input port). In FIGS. 2A and 2B, the vertical axis represents attenuation and the horizontal axis represents frequency.

In the existing directional coupler, coupling between the main line and the sub line is increased as the frequency of a signal increases. Hence, referring to FIG. 2A, in the amplitude characteristic of a coupling signal of the existing directional coupler, the ratio of the power output from the output port to the power input to the input port is increased as the frequency increases.

Hence, in the directional coupler 10*a*, the low pass filter LPF1 is provided between the sub line S1 and the sub line S2. The low pass filter LPF1, which includes a coil, a capacitor, or a transmission line, causes a phase shift to be generated in a signal (passing signal) passing therethrough in such a manner that the absolute value of the phase shift monotonically increases within the range from about 0 to about 180 degrees as the frequency increases in the predetermined frequency band. As a result, the amplitude characteristic of the coupling signal is made to be much closer to being flat in the directional coupler 10*a*, as illustrated in FIG. 2B.

Figure 3A:
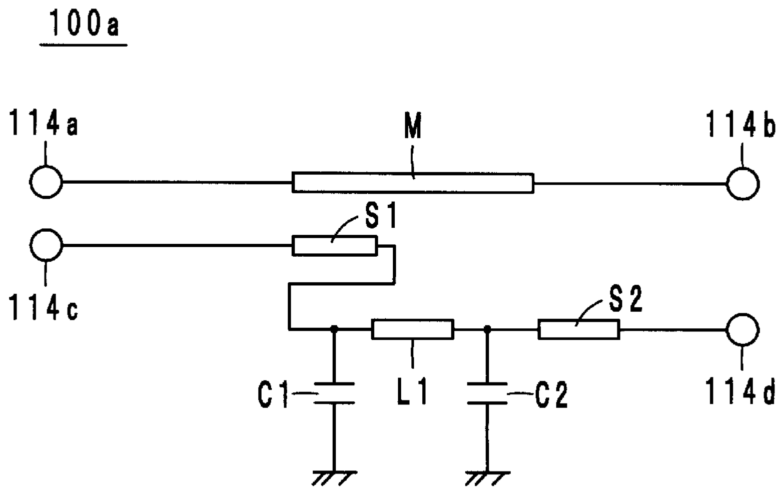
FIG. 3A is a circuit diagram of a directional coupler according to a first comparative example.
Figure 3B:
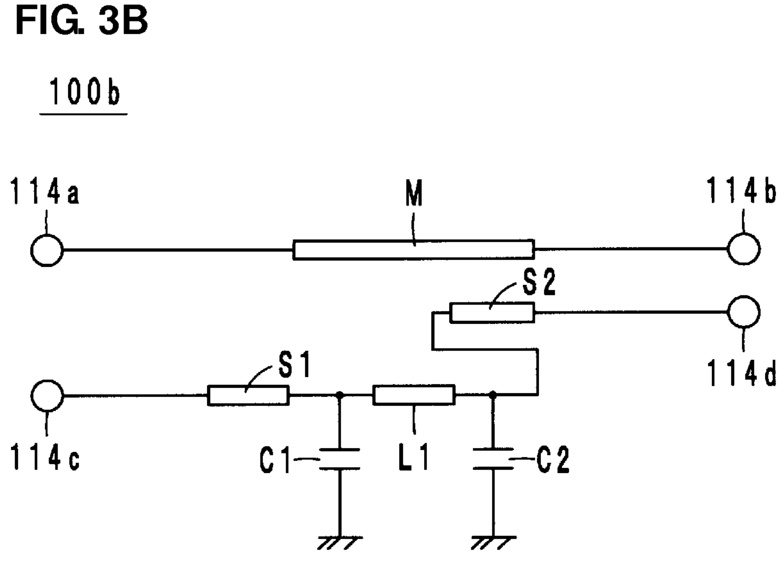
FIG. 3B is a circuit diagram of a directional coupler according to a second comparative example.

The inventor of the present application performed the simulation described below to confirm and clarify the advantages of the directional coupler 10*a*. FIG. 3A is a circuit diagram of a directional coupler 100*a* according to a first comparative example. FIG. 3B is a circuit diagram of a directional coupler 100*b* according to a second comparative example. Note that transmission loss that is generated when a signal passes through the main line M, the sub lines S1 and S2, and the low pass filter LPF1 is not considered in the simulation.

Referring to FIG. 3A, the sub line S2 is not coupled to the main line M in the directional coupler 100*a* according to the first comparative example. Referring to FIG. 3B, the sub line S1 is not coupled to the main line M in the directional coupler 100*b* according to the second comparative example.

Here, the sub lines S1 and S2 have the same length as described above. Hence, the coupling signal of a directional coupler which includes the sub line S1 and the main line M realized by removing the low pass filter LPF1 and the sub line S2 from the directional coupler in the equivalent circuit illustrated in FIG. 1, and the coupling signal of a directional coupler which includes the sub line S2 and the main line M realized by removing the low pass filter LPF1 and the sub line S1 from the directional coupler in the equivalent circuit illustrated in FIG. 1 have the same amplitude characteristic.

Figure 4A:
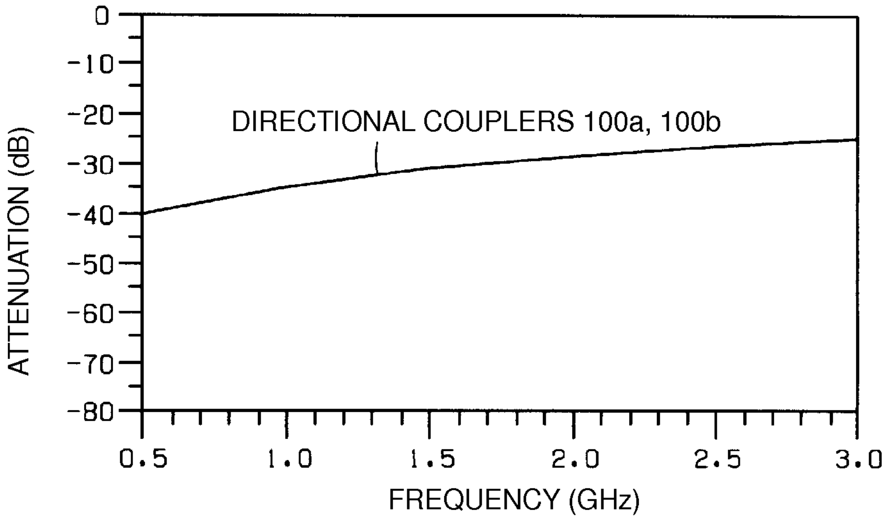
FIG. 4A is a graph illustrating the amplitude characteristics of coupling signals of directional couplers.
Figure 4B:
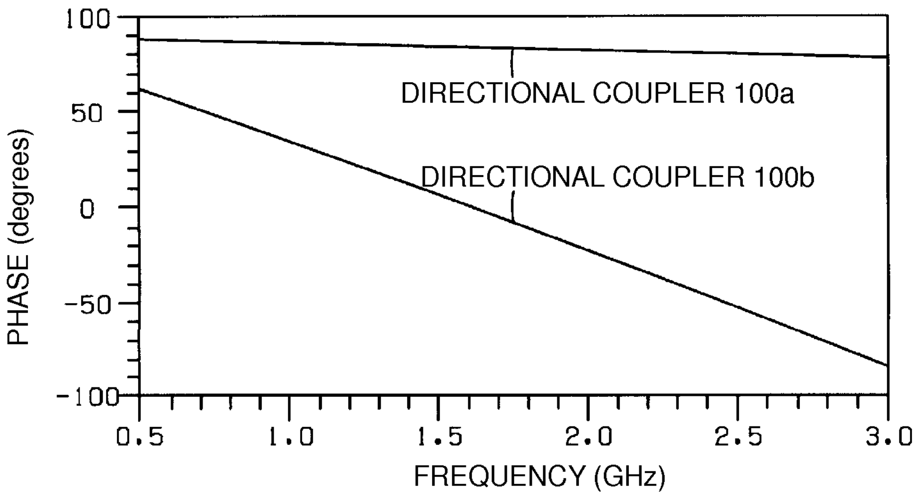
FIG. 4B is a graph illustrating the phase characteristics of coupling signals of directional couplers.

The amplitude characteristics and phase characteristics of coupling signals output from respective external electrodes 114*c* in the directional couplers 100*a* and 100*b* were studied. FIG. 4A is a graph illustrating the amplitude characteristics of the respective coupling signals of the directional couplers 100*a* and 100*b*. In FIG. 4A, the vertical axis represents attenuation and the horizontal axis represents frequency. FIG. 4B is a graph illustrating the phase characteristics of the respective coupling signals of the directional couplers 100*a* and 100*b*. In FIG. 4B, the vertical axis represents phase and the horizontal axis represents frequency.

Referring to FIG. 4A, when only one of the sub lines S1 and S2 is coupled to the main line M, the attenuation of the amplitude characteristics of the coupling signals of the directional couplers 100*a* and 100*b* changes by about −15 dB in the frequency range from about 0.5 GHz to about 3.0 GHz, and the amplitude characteristics are not flat. Further, referring to FIG. 4A, the amplitude characteristic of the coupling signal of the directional coupler 100*a* and the amplitude characteristic of the coupling signal of the directional coupler 100*b* are substantially the same. In other words, it can be seen that the amplitude characteristic of a coupling signal is not flattened when only one of the sub lines S1 and S2 is connected to the main line M. Hence, as will be described below, the amplitude characteristic of the coupling signal of the directional coupler 10*a* is flattened when both of the sub lines S1 and S2 are coupled to the main line M and the low pass filter LPF1 is connected between the sub lines S1 and S2.

Here, in the directional coupler 100*a*, a coupling signal output from the external electrode 114*c* is a signal generated through coupling of the sub line S1 and the main line M and, hence, does not pass through the low pass filter LPF1. On the other hand, in the directional coupler 100*b*, a coupling signal output from the external electrode 114*c* is a signal mainly generated through coupling of the sub line S2 and the main line M and, hence, passes through the low pass filter LPF1. In the directional coupler 10*a*, coupling signals generated in the sub lines S1 and S2 are combined and output from the external electrode 14*c*. In other words, a coupling signal output from the external electrode 14*c* of the directional coupler 10*a* can be considered to be a signal which is a combination of a coupling signal output from the external electrode 114*c* of the directional coupler 100*a* and a coupling signal output from the external electrode 114*c* of the directional coupler 100*b*.

Referring to FIG. 4B, whereas the phase characteristic of the coupling signal output from the external electrode 114*c* constantly shows substantially 90 degrees in the directional coupler 100*a*, the phase characteristic of the coupling signal output from the external electrode 114*c* changes from about 60 degrees to about −90 degrees in the directional coupler 100*b*. In the directional coupler 100*a*, a signal output from the external electrode 114*c* negligibly passes through the low pass filter LPF1. On the other hand, in the directional coupler 100*b*, a signal output from the external electrode 114*c* passes through the low pass filter LPF1. Hence, the difference in phase between the coupling signal output from the external electrode 114*c* of the directional coupler 100*a* and the coupling signal output from the external electrode 114*c* of the directional coupler 100*b* is generated by the low pass filter LPF1. In more detail, the difference in phase is generated in the coupling characteristics since the coupling signal output from the external electrode 114*c* of the directional coupler 100*b* passes through the low pass filter LPF1, unlike the coupling signal in the directional coupler 100*a*. Referring to FIG. 4B, the difference in phase between the coupling signal of the directional coupler 100*a* and the coupling signal of the directional coupler 100*b* monotonically increases from about 30 degrees to about 180 degrees with increasing frequency.

As described above, a signal output from the external electrode 14*c* of the directional coupler 10*a* is considered to be a signal which is a combination of a signal output from the external electrode 114*c* of the directional coupler 100*a* and a signal output from the external electrode 114*c* of the directional coupler 100*b*. In other words, the amplitude characteristic of the coupling signal of the directional coupler 10*a* is a combination of the amplitude characteristic of the coupling signal of the directional coupler 100*a* and the amplitude characteristic of the coupling signal of the directional coupler 100*b* for each frequency in accordance with a difference in phase between the two coupling signals.

Here, the amplitude characteristic of the coupling signal of the directional coupler 10*a* is flattened since the amplitude characteristic of the coupling signal of the directional coupler 100*a* and the amplitude characteristic of the coupling signal of the directional coupler 100*b* have a predetermined frequency-dependent difference in phase as illustrated in FIG. 4B.

By using the directional coupler 10*a* which has the circuit configuration described above, the isolation characteristic can be improved without increasing the sizes of the components, as will be described below. In other words, attenuation of the isolation characteristic can be increased. The isolation characteristic is defined as being the relationship between the frequency and the power ratio (i.e., attenuation) of a signal output from the external electrode 14*c* (coupling port) to a signal output from the external electrode 14*b* (output port).

Figure 5A:
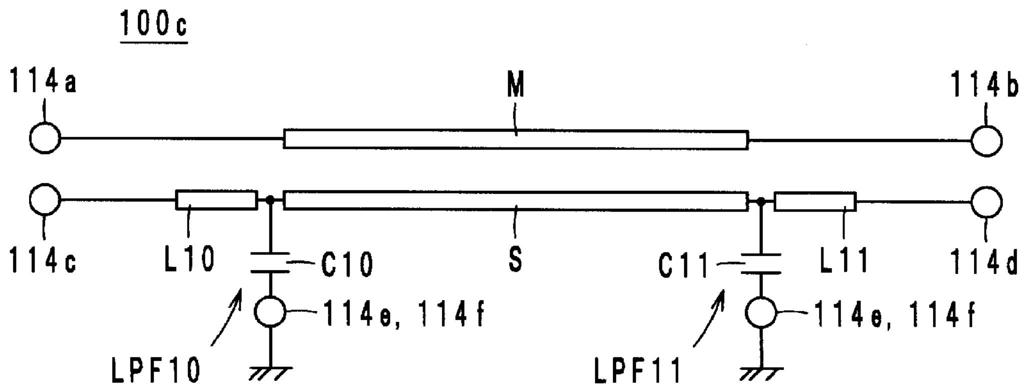
FIG. 5A is a circuit diagram of a directional coupler according to a third comparative example.
Figure 5B:
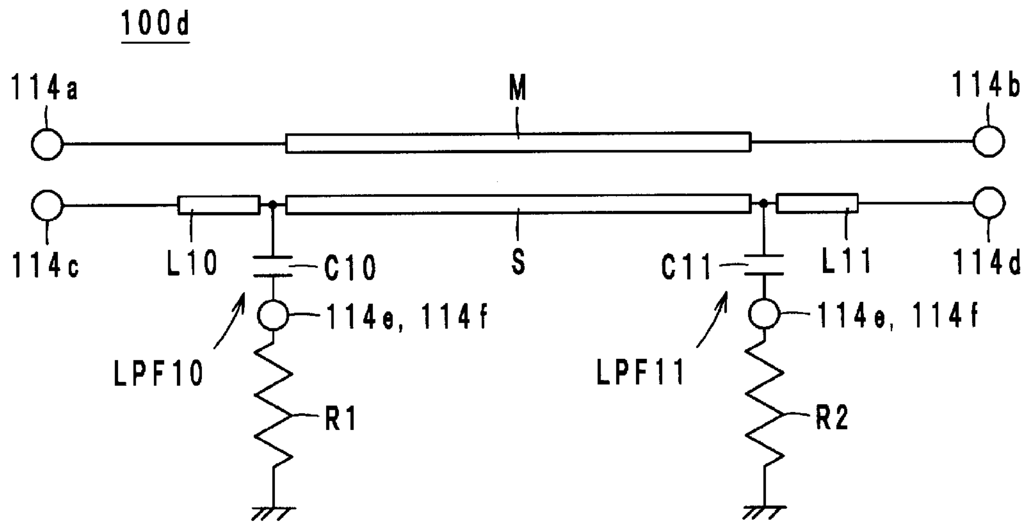
FIG. 5B is a circuit diagram of a directional coupler according to a fourth comparative example.

To confirm that the isolation characteristic of the directional coupler 10*a* is advantageous, the inventor of the present invention performed the simulation described below. FIG. 5A is a circuit diagram of a directional coupler 100*c* according to a third comparative example. FIG. 5B is a circuit diagram of a directional coupler 100*d* according to a fourth comparative example.

In the directional coupler 100*c* illustrated in FIG. 5A, the main line M is electromagnetically coupled to a sub line S. Low pass filters LPF10 and LPF11 are respectively connected to the two ends of the sub line S. In the directional coupler 100*d* illustrated in FIG. 5B, terminating resistors R1 and R2 are respectively inserted between the ground and external electrodes 114*e* and 114*f*, unlike in the directional coupler 100*c*.

Figure 6:
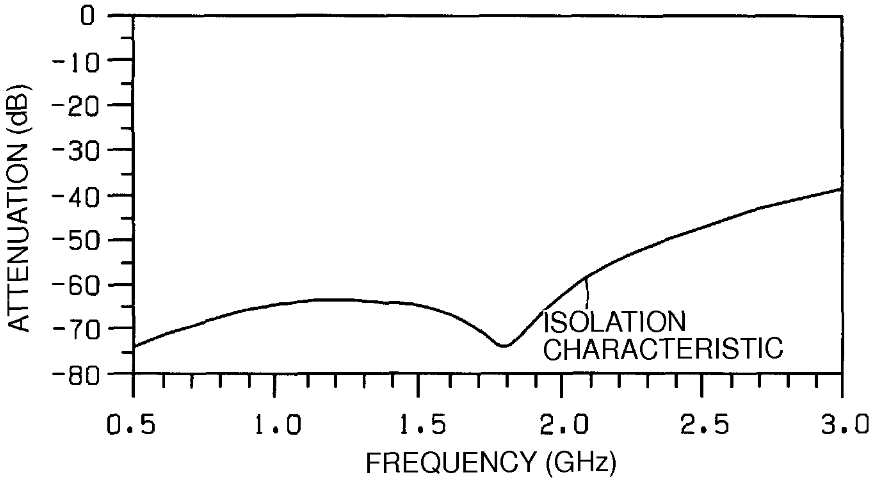
FIG. 6 is a graph illustrating the isolation characteristic of a directional coupler.
Figure 7A:
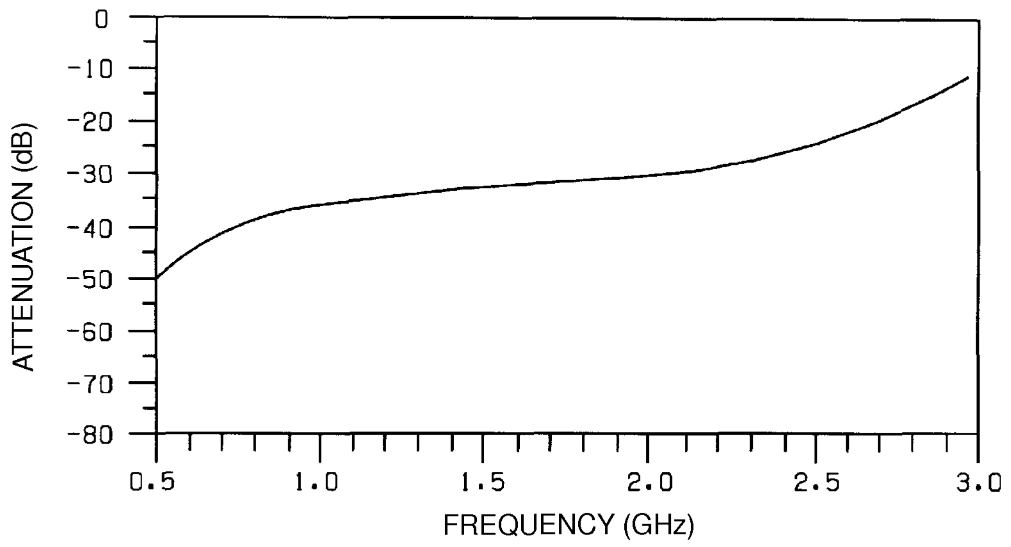
FIG. 7A is a graph illustrating the isolation characteristic of a directional coupler.
Figure 7B:
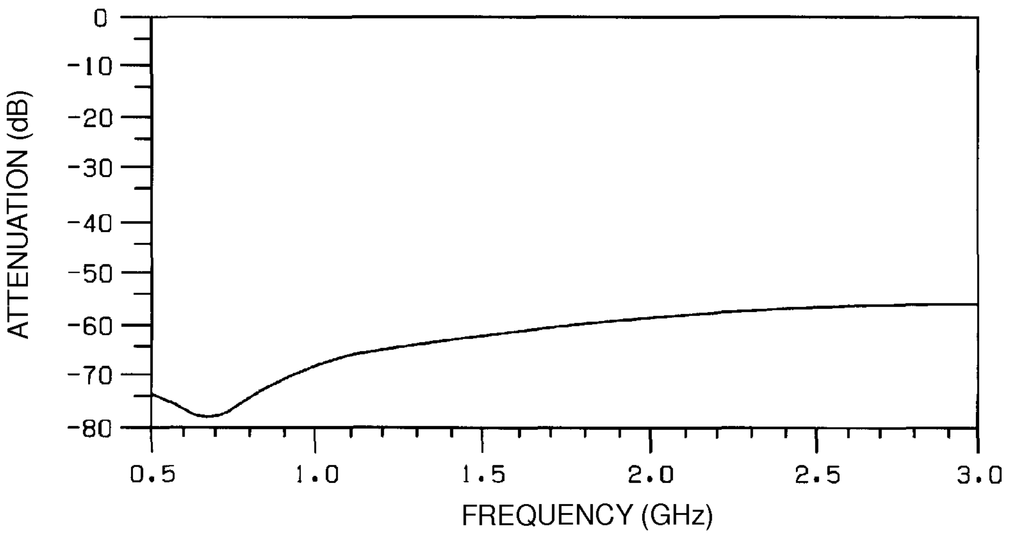
FIG. 7B is a graph illustrating the isolation characteristic of a directional coupler.

The isolation characteristics of the above-described directional coupler 10*a*, directional coupler 100*c*, and directional coupler 100*d* were studied. FIG. 6 is a graph illustrating the isolation characteristic of the directional coupler 10*a*. FIG. 7A is a graph illustrating the isolation characteristic of the directional coupler 100*c*. FIG. 7B is a graph illustrating the isolation characteristic of the directional coupler 100*d*. In FIGS. 6, 7A, and 7B, the vertical axis represents attenuation and the horizontal axis represents frequency.

In the directional coupler 100*c*, since the low pass filters LPF10 and LPF11 are provided, impedance matching between the sub line S and the external electrode 114*c* and between the sub line S and the external electrode 114*d* is not maintained. Hence, in the sub line S, a signal to be output to the external electrode 114*d* is reflected by the low pass filter LPF11 and output from the external electrode 114*c*. As a result, referring to FIG. 7A, the attenuation of the isolation characteristic of the directional coupler 100*c* is about −30 dB for a signal having, for example, a frequency in the predetermined frequency band from 1710 MHz to 1910 MHz (GSM 1800/1900).

Hence, the terminating resistors R1 and R2 are provided in the directional coupler 100*d*. As a result, undesired reflection of a signal between the sub line S and the low pass filters LPF10 and LPF11 is prevented. Hence, referring to FIG. 7B, the attenuation of the isolation characteristic of the directional coupler 100*d* is increased to about −60 dB for a signal having a frequency in the predetermined frequency band from 1710 MHz to 1910 MHz (GSM 1800/1900).

However, since the terminating resistors R1 and R2 are required in the directional coupler 100*d*, a space for providing the terminating resistors R1 and R2 is required in the directional coupler 100*d* or a space on a substrate for mounting the directional coupler 100*d*.

On the other hand, in the directional coupler 10*a*, the sub line is divided into two, the sub lines S1 and S2, and the low pass filter LPF1 is provided therebetween. With this configuration, the coupling signal of the sub line S1 and the coupling signal of the sub line S2 are made to have a difference in phase. Hence, reflection of a signal is not generated between the low pass filters in the directional coupler 10*a*. As a result, referring to FIG. 6, the attenuation of the isolation characteristic of the directional coupler 10*a* is increased to about −60 dB for a signal having a frequency in the predetermined frequency band from 1710 MHz to 1910 MHz (GSM 1800/1900), even though the terminating resistors R1 and R2 are not provided.

Figure 8:
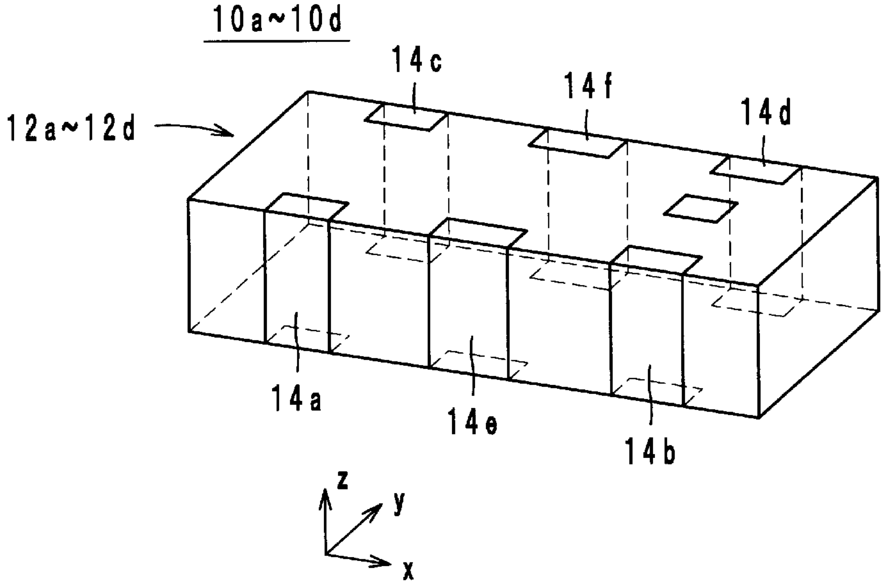
FIG. 8 is an external perspective view of directional couplers according to the first to fourth preferred embodiments of the present invention.
Figure 9:
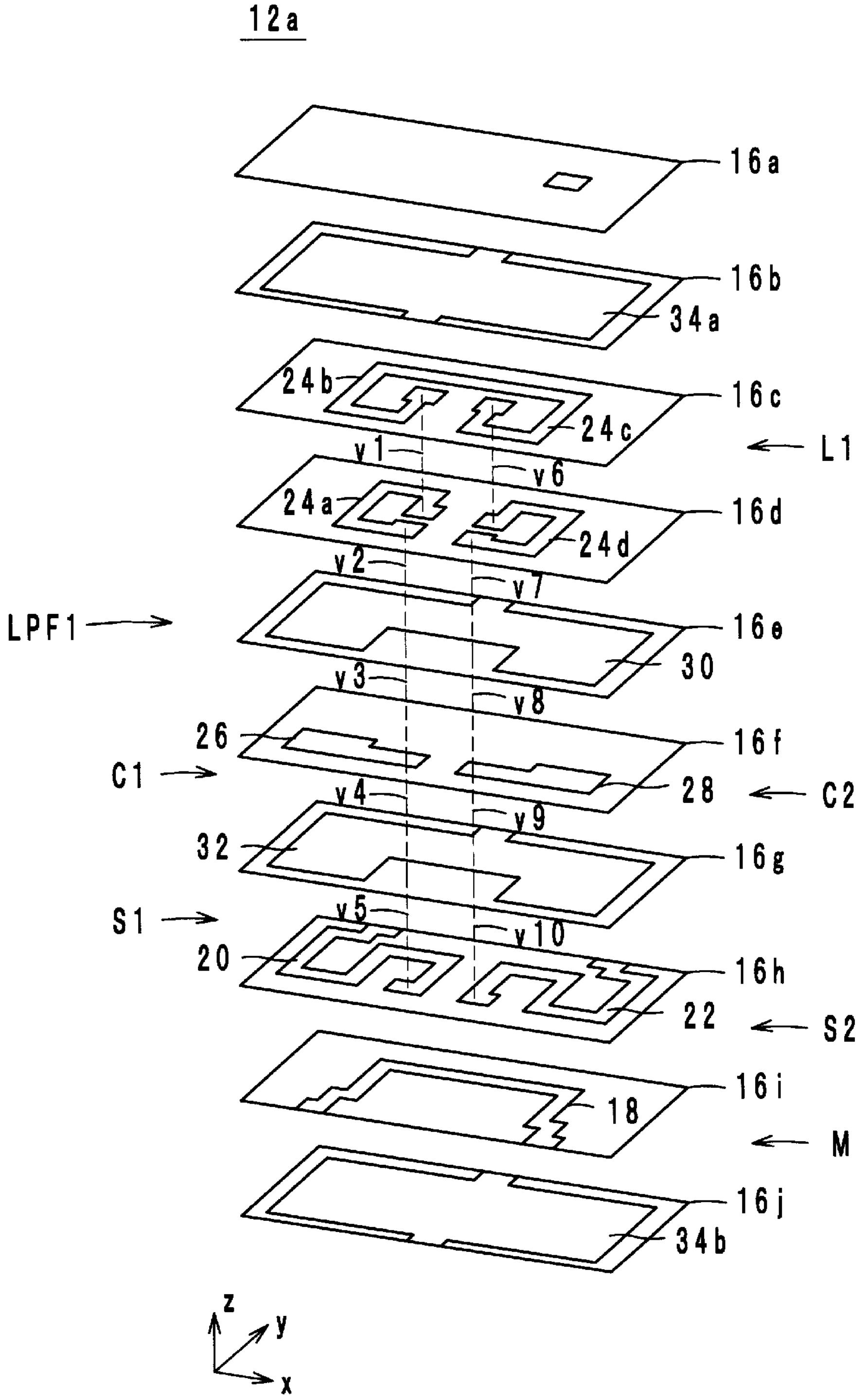
FIG. 9 is an exploded perspective view of a multilayer body of the directional coupler according to the first preferred embodiment of the present invention.

A specific configuration of the directional coupler 10*a* will now be described with reference to the drawings. FIG. 8 is an external perspective view of the directional couplers 10*a* to 10*c* according to the first to third preferred embodiments and a directional coupler 10*d* according to a fourth preferred embodiment. FIG. 9 is an exploded perspective view of a multilayer body 12*a* of the directional coupler 10*a* according to the first preferred embodiment. Hereinafter, the stacking direction is defined to be the z-axis, and the longitudinal direction of the directional coupler 10*a* when viewed in plan from the z-axis is defined to be the x-axis, and the lateral direction of the directional coupler 10*a* when viewed in plan from the z-axis is defined to be the y-axis. Note that the x-axis, y-axis, and z-axis are orthogonal to one another.

Referring to FIGS. 8 and 9, the directional coupler 10*a* includes the multilayer body 12*a*, external electrodes 14 (14*a* to 14*f*), the main line M, the sub lines S1 and S2, the low pass filter LPF1, shield conductor layers 34*a* and 34*b*, and via hole conductors v2 to v5 and v7 to v10. The multilayer body 12*a* preferably is substantially shaped like a rectangular parallelepiped as illustrated in FIG. 8, and is configured in such a manner that insulating layers 16 (16*a* to 16*j*) are stacked in this order from the positive z-axis direction side to the negative z-axis direction side, as illustrated in FIG. 9. A surface of the multilayer body 12*a* on the negative z-axis direction side is a mounting surface that faces a circuit board when the directional coupler 10*a* is mounted on the circuit board. The insulating layers 16 are made of a dielectric ceramic and are substantially shaped like rectangles.

The external electrodes 14*a*, 14*e*, and 14*b* are arranged on a side surface of the multilayer body 12*a* on the negative y-axis direction side in this order from the negative x-axis direction side to the positive x-axis direction side. The external electrodes 14*c*, 14*f*, and 14*d* are arranged on a side surface of the multilayer body 12*a* on the positive y-axis direction side in this order from the negative x-axis direction side to the positive x-axis direction side.

Referring to FIG. 9, the main line M includes a line 18. The line 18 preferably is a substantially U-shaped line conductor layer disposed on the insulating layer 16*i*. One end of the main line M is connected to the external electrode 14*a* and the other end of the main line M is connected to the external electrode 14*b*. As a result, the main line M is connected between the external electrodes 14*a* and 14*b*.

Referring to FIG. 9, the sub line S1, which includes a line 20, preferably is a substantially S-shaped line conductor layer provided on the insulating layer 16*h*. At least a portion of the sub line S1 overlaps the main line M when viewed in plan from the z-axis positive direction side. In other words, the main line M and the sub line S1 face each other with the insulating layer 16*h* therebetween. As a result, the main line M and the sub line S1 are electromagnetically coupled to each other. Further, one end of the sub line S1 (line 20) is connected to the external electrode 14*c*.

Referring to FIG. 9, the sub line S2, which includes a line 22, preferably is a substantially S-shaped line conductor layer provided on the insulating layers 16*h*. At least a portion of the sub line S2 overlaps the main line M when viewed in plan from the z-axis positive direction side. In other words, the main line M and the sub line S2 face each other with the insulating layers 16*h* therebetween. As a result, the main line M and the sub line S2 are electromagnetically coupled to each other. Further, one end of the sub line S2 (line 22) is connected to the external electrode 14*d*.

The low pass filter LPF1 preferably is defined by the coil L1 and the capacitors C1 and C2. Preferably, the coil L1 includes lines 24 (24*a* to 24*d*) and via hole conductors v1 and v6, and has a configuration in which a substantially spiral coil spirals clockwise going from the z-axis negative direction side to the z-axis positive direction side and a substantially spiral coil that spirals clockwise going from the z-axis positive direction side to the z-axis negative direction side are connected to each other. Here, regarding the coil L1, the upstream side end in the clockwise direction is referred to as an upstream end and the downstream side end in the clockwise direction is referred to as a downstream end.

The lines 24*a* and 24*d* are substantially line-shaped conductor layers provided on the insulating layer 16*d*. The lines 24*b* and 24*c* are substantially line-shaped conductor layers provided on the insulating layer 16*c*. The downstream end of the line 24*b* and the upstream end of the line 24*c* are connected to each other.

The via hole conductor v1, which extends through the insulating layer 16*c* in the z-axis direction, connects the downstream end of the line 24*a* to the upstream end of the line 24*b*. The via hole conductor v6 extends through the insulating layer 16*c* in the z-axis direction and connects the downstream end of the line 24*c* to the upstream end of the line 24*d*.

As described above, in the directional coupler 10*a*, the sub lines S1 and S2 are connected between the main line M and the coil L1 in the z-axis direction. As a result, the distance between the main line M and the coil L1 is increased and electromagnetic coupling between the main line M and the coil L1 is significantly suppressed.

The capacitor C1 is preferably defined by substantially planar conductor layers 26, 30, and 32. The substantially planar conductor layers (ground electrodes) 30 and 32 preferably are arranged so as to respectively cover almost the entireties of the insulating layers 16*e* and 16*g*, and are connected to the external electrode 14*f*. A substantially planar conductor layer (capacitor conductor) 26 is provided on the insulating layer 16*f* and is substantially shaped like a rectangle, for example. The substantially planar conductor layer 26 and the substantially planar conductor layers 30 and 32 are superposed with one another when viewed in plan from the z-axis direction. As a result, capacitances are generated between the substantially planar conductor layer 26 and the substantially planar conductor layers 30 and 32.

The capacitor C2 preferably is defined by substantially planar conductor layers 28, 30, and 32. The substantially planar conductor layers (ground electrodes) 30 and 32 are preferably arranged so as to respectively cover almost the entireties of the insulating layers 16*e* and 16*g*, and are connected to the external electrode 14*f*. A substantially planar conductor layer (capacitor conductor) 28 is provided on the insulating layer 16*f* and is substantially shaped like a rectangle, for example. The substantially planar conductor layer 28 and the substantially planar conductor layers 30 and 32 are superposed with one another when viewed in plan from the z-axis direction. As a result, capacitances are generated between the substantially planar conductor layer 28 and the substantially planar conductor layers 30 and 32.

As described above, the capacitors C1 and C2 are provided between the main line M and the coil L1 in the z-axis direction. In more detail, the substantially planar conductor layers 30 and 32 which are maintained at a ground potential are provided between the main line M and the coil L1 in the z-axis direction. As a result, electromagnetic coupling between the main line M and the coil L1 is significantly suppressed.

The via hole conductors v2 to v5 extend through the insulating layers 16*d* to 16*g* in the z-axis direction and are connected to one another, thereby defining a single via hole conductor. The positive z-axis direction side end of the via hole conductor v2 is connected to the upstream end of the line 24*a*. The negative z-axis direction side end of the via hole conductor v3 is connected to the substantially planar conductor layer 26. The positive z-axis direction side end of the via hole conductor v4 is connected to the substantially planar conductor layer 26. The negative z-axis direction side end of the via hole conductor v5 is connected to the other end of the sub line S1 (line 20).

The via hole conductors v7 to v10 extend through the insulating layers 16*d* to 16*g* in the z-axis direction and are connected to one another, thereby defining a single via hole conductor. The positive z-axis direction side end of the via hole conductor v7 is connected to the downstream end of the line 24*d*. The negative z-axis direction side end of the via hole conductor v8 is connected to the substantially planar conductor layer 28. The positive z-axis direction side end of the via hole conductor v9 is connected to the substantially planar conductor layer 28. The negative z-axis direction side end of the via hole conductor v10 is connected to the other end of the sub line S2 (line 22).

By forming the directional coupler 10*a* as described above, the coil L1 is connected between the sub lines S1 and S2. Further, the capacitor C1 is connected between the external electrode 14*f* and a node between the coil L1 and the sub line S1. The capacitor C2 is connected between the external electrode 14*f* and a node between the coil L1 and the sub line S2.

The shield conductor layer 34*a* is preferably arranged so as to cover substantially the entire surface of the insulating layer 16*b*, and is connected to the external electrodes 14*e* and 14*f*. In other words, the potential of the shield conductor layer 34*a* is maintained at the ground potential. The shield conductor layer 34*a* is provided on the z-axis positive direction side of the main line M, the sub lines S1 and S2, and the low pass filter LPF1 in the z-axis direction. As a result, intrusion of noise into the directional coupler 10*a* is significantly suppressed, and radiation of noise from the directional coupler 10*a* is also significantly suppressed.

The shield conductor layer 34*b* is preferably arranged so as to cover substantially the entire surface of the insulating layer 16*j*, and is connected to the external electrodes 14*e* and 14*f*. In other words, the potential of the shield conductor layer 34*b* is maintained at the ground potential. The shield conductor layer 34*b* is provided on the z-axis negative direction side (i.e., near the mounting surface) of the main line M, the sub lines S1 and S2, and the low pass filter LPF1 in the z-axis direction. As a result, intrusion of noise into the directional coupler 10*a* is significantly suppressed, and radiation of noise from the directional coupler 10*a* is also significantly suppressed.

Second Preferred Embodiment

Figure 10:
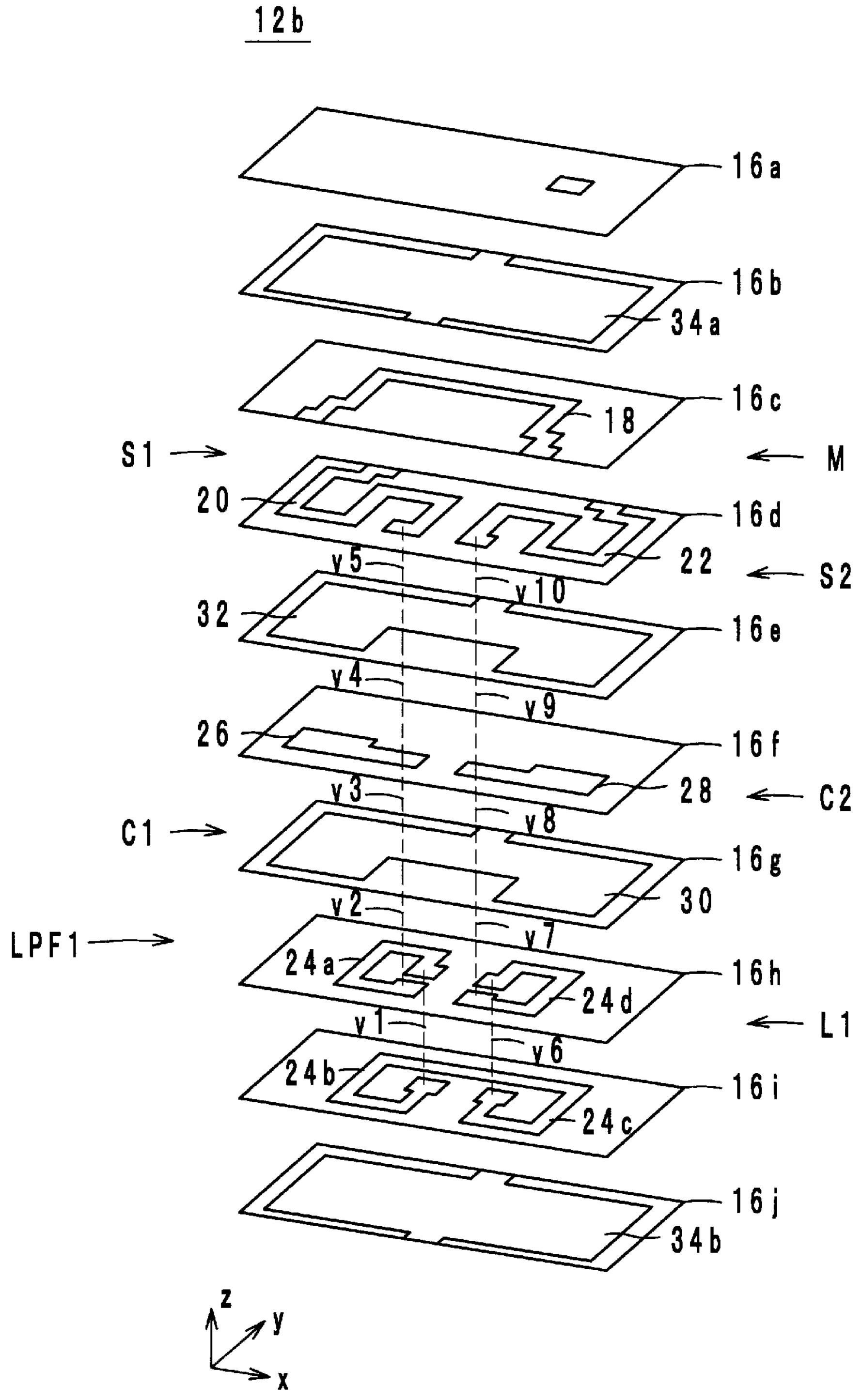
FIG. 10 is an exploded perspective view of a multilayer body of the directional coupler according to the second preferred embodiment of the present invention.

Hereinafter, the configuration of a directional coupler 10*b* according to a second preferred embodiment will be described with reference to the drawings. FIG. 10 is an exploded perspective view of a multilayer body 12*b* of the directional coupler 10*b* according to the second preferred embodiment.

Since the circuit configuration of the directional coupler 10*b* is preferably the same as that of the directional coupler 10*a*, the description thereof is omitted. Referring to FIG. 10, the differences between the directional coupler 10*a* and the directional coupler 10*b* lie in the arrangement of the main line M, the sub lines S1 and S2, the capacitors C1 and C2, and the coil L1. In more detail, in the directional coupler 10*a* illustrated in FIG. 9, the main line M, the sub lines S1 and S2, the capacitors C1 and C2, and the coil L1 are arranged in this order from the negative z-axis direction side to the positive the z-axis direction side. On the other hand, in the directional coupler 10*b* illustrated in FIG. 10, the main line M, the sub lines S1 and S2, the capacitors C1 and C2, and the coil L1 are arranged in this order from the positive z-axis direction side to the negative z-axis direction side.

The directional coupler 10*b* configured as described above has the same operations and advantages as the directional coupler 10*a*.

Third Preferred Embodiment

Figure 11:
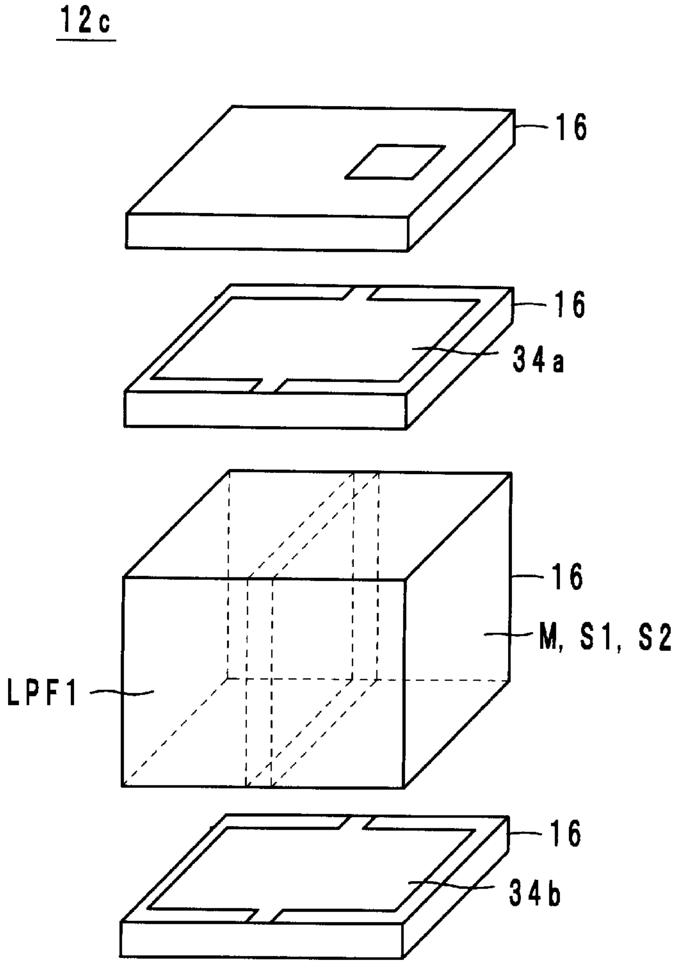
FIG. 11 is an exploded perspective view of a multilayer body of the directional coupler according to the third preferred embodiment of the present invention.

Hereinafter, a directional coupler 10*c* according to a third preferred embodiment will be described with reference to the drawing. FIG. 11 is an exploded perspective view of a multilayer body 12*c* of the directional coupler 10*c* according to the third preferred embodiment.

Since the circuit configuration of the directional coupler 10*c* is preferably the same as those of the directional couplers 10*a* and 10*b*, the description thereof is omitted. The differences between the directional coupler 10*a* and the directional coupler 10*c* lie in the arrangement of the main line M, the sub lines S1 and S2, and the low pass filter LPF1. In more detail, in the directional coupler 10*c* illustrated in FIG. 11, the main line M, the sub lines S1 and S2, and the low pass filter LPF1 are arranged in the x-axis direction. As a result, the directional coupler 10*c* enables a reduction in the height of the device.

Fourth Preferred Embodiment

Figure 12:
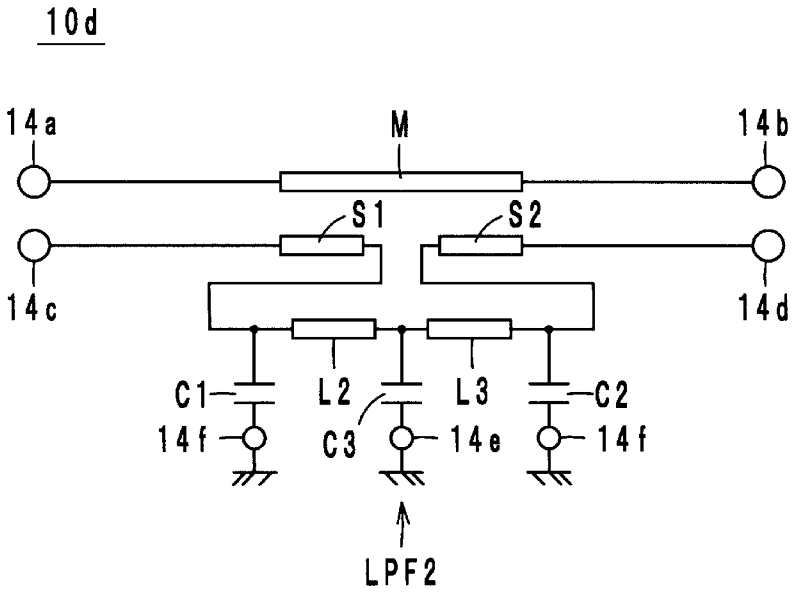
FIG. 12 is a circuit diagram of the directional coupler according to the fourth preferred embodiment of the present invention.

Hereinafter, a directional coupler 10*d* according to a fourth preferred embodiment will be described with reference to the drawing. FIG. 12 is a circuit diagram of the directional coupler 10*d* according to the fourth preferred embodiment.

The directional coupler 10*d* includes the external electrodes (terminals) 14*a* to 14*f*, the main line M, the sub lines S1 and S2, and a low pass filter LPF2 in the circuit configuration thereof. The main line M is connected between the external electrodes 14*a* and 14*b*. The sub line S1 is connected to the external electrode 14*c* and is electromagnetically coupled to the main line M. The sub line S2 is connected to the external electrode 14*d* and is electromagnetically coupled to the main line M.

The low pass filter LPF2 is connected between the sub line S1 and the sub line S2 and is a phase conversion unit that causes a phase shift to be generated in a signal passing therethrough in such a manner that the absolute value of the phase shift monotonically increases within the range from about 0 to about 180 degrees as the frequency increases in the predetermined frequency band. The low pass filter LPF2 includes coils L2 and L3 and capacitors C1 to C3.

The coils L2 and L3 are connected in series between the sub lines S1 and S2 and are not electromagnetically coupled to the main line M. The coil L2 is connected to the sub line S1, and the coil L3 is connected to the sub line S2.

The capacitor C1 is connected to one end of the coil L2. In more detail, the capacitor C1 is connected between the external electrode 14*f* and a connection node between the coil L2 and the sub line S1. The capacitor C2 is connected to one end of the coil L3. In more detail, the capacitor C2 is connected between the external electrode 14*f* and a connection node between the coil L3 and the sub line S2. The capacitor C3 is connected between the external electrode 14*e* and a node between the coil L2 and the coil L3.

In the directional coupler 10*d* described above, the external electrode 14*a* is preferably used as an input port and the external electrode 14*b* is preferably used as an output port. The external electrode 14*c* is preferably used as a coupling port. The external electrode 14*d* is preferably used as a termination port terminated by a resistance of about 50Ω, for example. The external electrodes 14*e* and 14*f* are used as ground ports that are grounded. When a signal is input to the external electrode 14*a*, the signal is output from the external electrode 14*b*. Further, since the main line M and the sub line S are electromagnetically coupled to each other, a signal whose power is proportional to that of the signal output from the external electrode 14*b* is output from the external electrode 14*c*.

The directional coupler 10*d* with the circuit configuration described above causes the amplitude characteristic of a coupling signal to be much closer to being flat similarly to the directional coupler 10*a*.

Further, since the low pass filter LPF2 including the plural coils L2 and L3 and the plural capacitors C1 to C3 is provided, the directional coupler 10*d* causes the amplitude characteristic of a coupling signal to be even closer to being flat.

Figure 13:
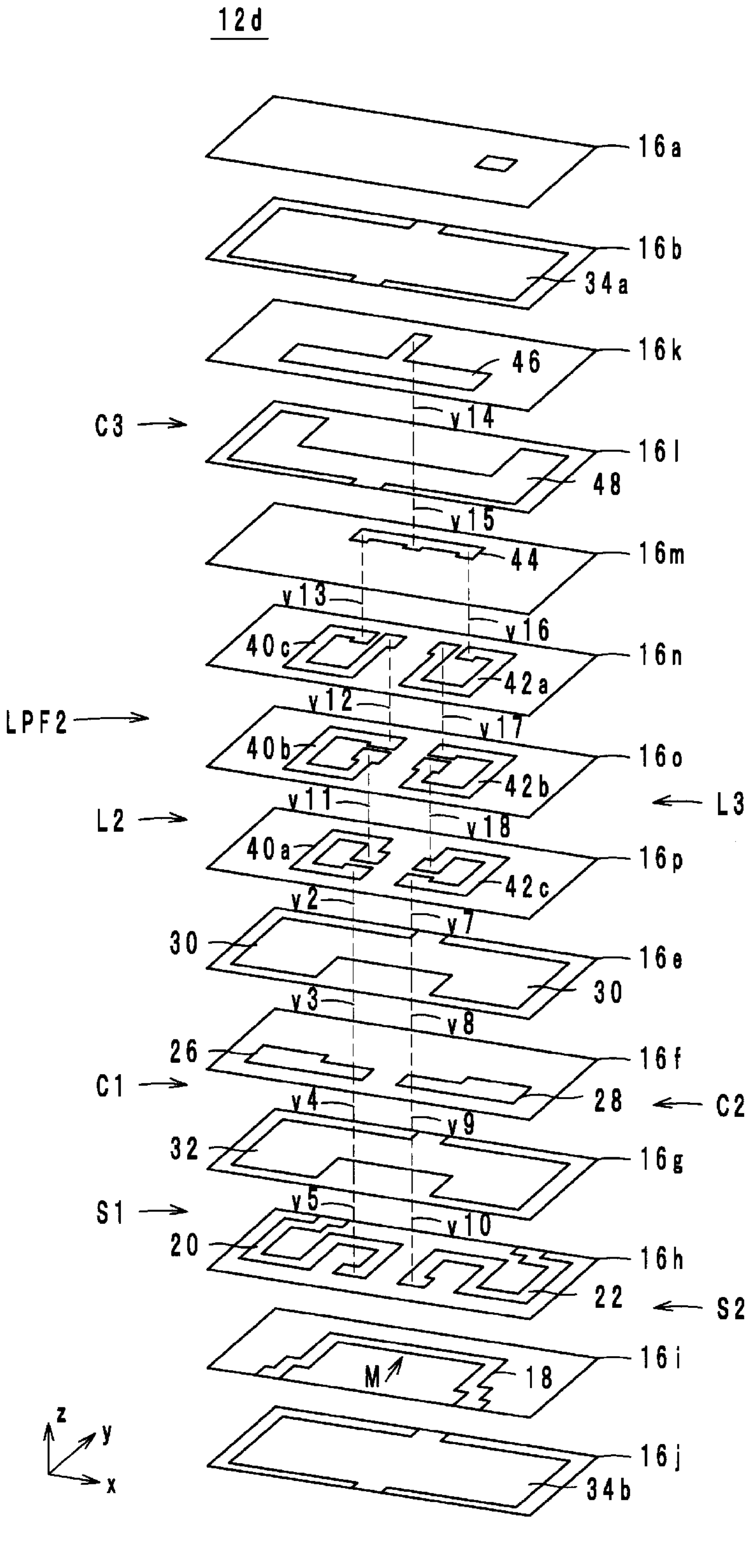
FIG. 13 is an exploded perspective view of a multilayer body of the directional coupler according to the fourth preferred embodiment of the present invention.

A specific configuration of the directional coupler 10*d* will now be described with reference to the drawings. FIG. 13 is an exploded perspective view of a multilayer body 12*d* of the directional coupler 10*d* according to the fourth preferred embodiment.

Referring to FIGS. 8 and 13, the directional coupler 10*d* includes the multilayer body 12*d*, the external electrodes 14 (14*a* to 14*f*), the main line M, the sub lines S1 and S2, the low pass filter LPF2, the shield conductor layers 34*a* and 34*b*, a connection conductor layer 44, the via hole conductors v2 to v5 and v7 to v10, and via hole conductors v13 to v16.

The multilayer body 12*d* includes insulating layers 16*k* to 16*p* instead of the insulating layers 16*c* and 16*d*. Note that the structures of the insulating layers 16*a*, 16*b*, and 16*e* to 16*j* of the multilayer body 12*d* are preferably the same as those of the insulating layers 16*a*, 16*b*, and 16*e* to 16*j* of the multilayer body 10*a* and, hence, the descriptions thereof are omitted.

The low pass filter LPF2 includes the coils L2 and L3 and the capacitors C1 to C3. The coil L2 includes lines 40 (40*a* to 40*c*) and via hole conductors vii and v12, and is configured to be a substantially spiral coil that spirals clockwise when going from the negative z-axis direction side to the positive the z-axis direction side. Here, regarding the coil L2, the upstream side end in the clockwise direction is referred to as an upstream end and the downstream side end in the clockwise direction is referred to as a downstream end.

The line 40*a* preferably is a substantially line-shaped conductor layer provided on the insulating layer 16*p*. The line 40*b* preferably is a substantially line-shaped conductor layer provided on the insulating layer 16*o*. The line 40*c* preferably is a substantially line-shaped conductor layer provided on the insulating layer 16*n*.

The via hole conductor vii extends through the insulating layer 16*o* in the z-axis direction, and connects the downstream end of the line 40*a* and the upstream end of the line 40*b* to each other. The via hole conductor v12 extends through the insulating layer 16*n* in the z-axis direction, and connects the downstream end of the line 40*b* and the upstream end of the line 40*c* to each other.

The coil L3 includes lines 42 (42*a* to 42*c*) and the via hole conductors v17 and v18, and is preferably a substantially spiral coil that spirals clockwise when going from the positive z-axis direction side to the negative the z-axis direction side. Here, regarding the coil L3, the upstream side end in the clockwise direction is referred to as an upstream end and the downstream side end in the clockwise direction is referred to as a downstream end.

The lines 42*a* to 42*c* preferably are substantially line-shaped conductor layers respectively arranged on the insulating layers 16*n* to 16*p*. The via hole conductor v17 extends through the insulating layer 16*o* in the z-axis direction, and connects the downstream end of the line 42*a* and the upstream end of the line 42*b* to each other. The via hole conductor v18 extends through the insulating layer 16*o* in the z-axis direction, and connects the downstream end of the line 42*b* and the upstream end of the line 42*c* to each other.

The upstream end of the line 40*a* is connected to the positive z-axis direction side end of the via hole conductor v2. Similarly, the downstream end of the line 42*c* is connected to the positive z-axis direction side end of the via hole conductor v7.

The capacitor C3 is preferably defined by substantially planar layers 46 and 48. The substantially planar layer (ground conductor) 48 is preferably arranged so as to cover almost the entirety of the insulating layer 16*l* and is connected to the external electrode 14*e*. The substantially planar layer (capacitor conductor) 46 preferably is provided on the insulating layer 16*k* and is substantially T-shaped. The substantially planar layer 46 overlaps the substantially planar layer 48 when viewed in plan from the z-axis direction. As a result, capacitance is generated between the substantially planar layer 46 and the substantially planar layer 48.

The connection conductor layer 44 preferably is a substantially line-shaped conductor layer provided on the insulating layer 16*m* and extends in the x-axis direction. The via hole conductors v13 and v16 extend through the insulating layer 16*m* in the z-axis direction. The negative z-axis direction side end of the via hole conductor v13 is connected to the downstream end of the line 40*c*. The positive z-axis direction side end of the via hole conductor v13 is connected to the negative x-axis direction side end of the connection conductor layer 44. The negative z-axis direction side end of the via hole conductor v16 is connected to the upstream end of the line 42*a*. The positive z-axis direction side end of the via hole conductor v16 is connected to the positive x-axis direction side end of the connection conductor layer 44.

The via hole conductors v14 and v15 respectively extend through the insulating layers 16*k* and 16*l* in the z-axis direction, and are connected to each other, thereby defining a single via hole conductor. The positive z-axis direction side end of the via hole conductor v14 is connected to the substantially planar layer 46. The negative z-axis direction side end of the via hole conductor v15 is connected to the connection conductor layer 44.

By forming the directional coupler 10*d* as described above, the coils L2 and L3 are connected between the sub lines S1 and S2. Further, the capacitor C3 is connected between the external electrode 14*e* and a node between the coil L2 and the coil L3.

Note that a high pass filter HPF or a transmission line may be used instead of the low pass filters LPF1 and LPF2 in the directional couplers 10*a* to 10*d*.

As described above, preferred embodiments of the present invention are useful for directional couplers and provide advantages in that the amplitude characteristic of a coupling signal is caused to be much closer to being flat.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A directional coupler used in a predetermined frequency band, the directional coupler comprising:

first, second, third and fourth terminals;

a main line connected between the first terminal and the second terminal;

a first sub line that is connected to the third terminal and electromagnetically coupled to the main line;

a second sub line that is connected to the fourth terminal and electromagnetically coupled to the main line; and a phase conversion unit that is connected between the first sub line and the second sub line and that causes a phase shift to be generated in a passing signal passing therethrough; wherein a cut-off frequency of the low pass filter is not within the predetermined frequency band used in the directional coupler; and the phase conversion unit includes a low pass filter.

2. The directional coupler according to claim 1, wherein an absolute value of the phase shift caused to be generated in the passing signal by the phase conversion unit monotonically increases within a range from about 0 to about 180 degrees with increasing frequency in the predetermined frequency band.

3. The directional coupler according to claim 1, wherein the first terminal is an input terminal that receives a first signal, the second terminal is a first output terminal that outputs the first signal, the third terminal is a second output terminal that outputs a second signal that has a power proportional to a power of the first signal, and the fourth terminal is a termination terminal that is terminated.

4. The directional coupler according to Claim 1, wherein the low pass filter includes:

a coil that is not electromagnetically coupled to the main line; and a capacitor that is connected to an end of the coil.

5. The directional coupler according to claim 1, further comprising a multilayer body including a plurality of insulating layers stacked on each other, wherein the first sub line, the second sub line, and the phase conversion unit are defined by conductor layers provided on the insulating layers.

6. The directional coupler according to claim 5, wherein the sub lines face the main line with the insulating layer therebetween.

7. The directional coupler according to claim 5, further comprising a shield layer maintained at a ground potential, wherein one surface of the multilayer body in the stacking direction is a mounting surface, and the shield layer is provided at a location that is nearer to the mounting surface than the main line, the first sub line, the second sub line, and the phase conversion unit.

8. The directional coupler according to claim 5, wherein the low pass filter includes:

a coil that is not electromagnetically coupled to the main line; and a capacitor that is connected to an end of the coil; wherein the sub lines are provided between the coil and the main line in a stacking direction.

9. The directional coupler according to claim 8, wherein the capacitor is provided between the main line and the coil in the stacking direction.

10. The directional coupler according to claim 9, wherein a ground conductor is provided between the main line and the coil in the stacking direction.

11. The directional coupler according to claim 8, wherein the main line and the low pass filter are arranged to extend in a direction perpendicular or substantially perpendicular to the stacking direction.

12. A directional coupler used in a predetermined frequency band, the directional coupler comprising:

first, second, third and fourth terminals;

a main line connected between the first terminal and the second terminal;

a first sub line that is connected to the third terminal and electromagnetically coupled to the main line;

a second sub line that is connected to the fourth terminal and electromagnetically coupled to the main line;

a phase conversion unit that includes a low pass filter and is connected between the first sub line and the second sub line and that causes a phase shift to be generated in a passing signal passing therethrough; and a multilayer body including a plurality of insulating layers stacked on each other in a stacking direction, wherein the first sub line, the second sub line, and the phase conversion unit are defined by conductor layers provided on the insulating layers; wherein the low pass filter includes:

a coil that is not electromagnetically coupled to the main line; and a capacitor that is connected to an end of the coil; and the sub lines are provided between the coil and the main line in the stacking direction.

13. The directional coupler according to claim 12, wherein an absolute value of the phase shift caused to be generated in the passing signal by the phase conversion unit monotonically increases within a range from about 0 to about 180 degrees with increasing frequency in the predetermined frequency band.

14. The directional coupler according to claim 12, wherein a cut-off frequency of the low pass filter is not within the predetermined frequency band used in the directional coupler.

15. The directional coupler according to claim 12, wherein the capacitor is provided between the main line and the coil in the stacking direction.

16. The directional coupler according to claim 15, wherein a ground conductor is provided between the main line and the coil in the stacking direction.

17. The directional coupler according to claim 12, wherein the main line and the low pass filter are arranged to extend in a direction perpendicular or substantially perpendicular to the stacking direction.

18. The directional coupler according to claim 12, wherein the sub lines face the main line with the insulating layer therebetween.

19. The directional coupler according to claim 12, further comprising a shield layer maintained at a ground potential, wherein one surface of the multilayer body in the stacking direction is a mounting surface, and the shield layer is provided at a location that is nearer to the mounting surface than the main line, the first sub line, the second sub line, and the phase conversion unit.

20. The directional coupler according to claim 12, wherein the first terminal is an input terminal that receives a first signal, the second terminal is a first output terminal that outputs the first signal, the third terminal is a second output terminal that outputs a second signal that has a power proportional to a power of the first signal, and the fourth terminal is a termination terminal that is terminated.

* * * * *